United States Patent
Liu et al.

(10) Patent No.: US 9,647,013 B2
(45) Date of Patent: May 9, 2017

(54) MANUFACTURING METHOD OF TFT ARRAY SUBSTRATE

(71) Applicant: BOE TECHNOLOGY GROUP CO., LTD., Beijing (CN)

(72) Inventors: Xiang Liu, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 53 days.

(21) Appl. No.: 13/704,156

(22) PCT Filed: Nov. 14, 2012

(86) PCT No.: PCT/CN2012/084598
§ 371 (c)(1),
(2) Date: Dec. 13, 2012

(87) PCT Pub. No.: WO2013/097554
PCT Pub. Date: Jul. 4, 2013

(65) Prior Publication Data
US 2014/0154823 A1  Jun. 5, 2014

(30) Foreign Application Priority Data
Dec. 31, 2011 (CN) .......................... 2011 1 0460545

(51) Int. Cl.
*H01L 29/786* (2006.01)
*H01L 27/12* (2006.01)

(52) U.S. Cl.
CPC ...... *H01L 27/1288* (2013.01); *H01L 27/1225* (2013.01); *H01L 29/7869* (2013.01)

(58) Field of Classification Search
CPC ... H01L 27/124; H01L 27/12; H01L 27/1288; H01L 27/1225; H01L 29/78606; H01L 29/66969; H01L 29/7869
(Continued)

(56) References Cited

U.S. PATENT DOCUMENTS 6,037,609 A * 3/2000 Liu et al. ................ 257/59
7,288,477 B2 * 10/2007 Choi et al. ............ 438/637
(Continued)

FOREIGN PATENT DOCUMENTS

CN     101807585 A    8/2010
CN     101819361 A    9/2010
(Continued)

OTHER PUBLICATIONS

Cornell NanoScale & Technology Facility (CNF), "Plasma Enhanced Chemical Vapor Deposition Capabilities," Apr. 15, 2008.*
(Continued)

*Primary Examiner* — John P Dulka
*Assistant Examiner* — Christina Sylvia
(74) *Attorney, Agent, or Firm* — Ladas & Parry LLP

(57) ABSTRACT

Embodiments of the invention provide a manufacturing method of a TFT array substrate. The TFT array substrate is formed to comprise a plurality of scanning lines, a plurality of data lines and a plurality of pixel units defined by intersecting these scanning lines and these data lines with each other. Each of the pixel units comprises a TFT and a pixel electrode. The TFT is formed to comprise a gate electrode, a gate insulating layer, a metal oxide semiconductor layer used as an active layer, an etch stopping layer formed on a portion of the surface of the metal oxide semiconductor layer, a source electrode and a drain electrode. In this method, the metal oxide semiconductor layer, the source electrode and the drain electrode are formed by a same patterning process.

15 Claims, 3 Drawing Sheets

(58) Field of Classification Search
USPC .................................................. 438/30, 34
See application file for complete search history.

(56) References Cited

U.S. PATENT DOCUMENTS

| | | | |
|---|---|---|---|
| 2008/0020528 A1* | 1/2008 | Kakehata et al. | 438/259 |
| 2009/0236597 A1* | 9/2009 | Ye | 257/43 |
| 2009/0305473 A1* | 12/2009 | Luo et al. | 438/158 |
| 2010/0053041 A1* | 3/2010 | Abe et al. | 345/76 |
| 2010/0208156 A1* | 8/2010 | Liu | 349/46 |
| 2010/0225860 A1* | 9/2010 | Huang | G02F 1/136209 349/110 |
| 2011/0163310 A1* | 7/2011 | Park | H01L 29/78606 257/43 |
| 2011/0253998 A1 | 10/2011 | Theiss et al. | |
| 2012/0012846 A1 | 1/2012 | Isa et al. | |
| 2012/0070946 A1* | 3/2012 | Hsieh | H01L 27/1255 438/158 |

FOREIGN PATENT DOCUMENTS

| | | |
|---|---|---|
| CN | 102651340 A | 8/2012 |
| JP | 01-133369 A | 5/1989 |
| KR | 20060087455 A | 8/2006 |
| WO | 2009/117438 A2 | 9/2009 |
| WO | 2011/037829 A2 | 3/2011 |
| WO | 2011/056294 A1 | 5/2011 |

OTHER PUBLICATIONS

International Search Report mailed Feb. 28, 2013; PCT/CN2012/084598.
First Chinese Office Action dated Aug. 5, 2013; Appln. No. 201110460545.7.
Second Chinese Office Action dated Mar. 13, 2014; Appln. No. 201110460545.7.
International Preliminary Report on Patentability dated Jul. 1, 2014; PCT/CN2012084598.

* cited by examiner

MANUFACTURING METHOD OF TFT ARRAY SUBSTRATE

TECHNICAL FIELD

Embodiments of the invention relate to a manufacturing method of a TFT array substrate.

BACKGROUND

Presently, heavy CRT display has been gradually replaced by flat panel display. Popular flat panel display comprises liquid crystal display (LCD) and organic light emission display (OLED).

In the LCD, each pixel unit is driven by a corresponding thin film transistor (TFT) in a TFT array substrate and cooperates with external circuits so as to realize display of images. In the active matrix organic light emission display (AMOLED), each OLED pixel unit is driven by a corresponding TFT in a TFT array substrate and cooperates with external circuits so as to realize display of images. In the displays described above, the TFT is used as a switch element and is a key element for image display. The performance of the TFT directly determines the performance of the flat panel display.

The TFT which has been industrialized mainly comprises amorphous silicon TFT, polycrystalline silicon TFT, monocrystalline silicon TFT, and amorphous silicon TFT is most frequently used for the TFT array substrate of the flat panel display.

Recently, metal oxide TFT has been researched and developed. The metal oxide TFT has the advantage of high carrier mobility, in this case, the size of the TFT can become smaller, and thus the resolution of the flat panel display can be increased and the display quality can be improved. Furthermore, the metal oxide TFT further has advantages of uniform characteristics, low cost of materials and processes, low process temperature, suitable for coating process, high transmittance, large band gap and the like.

Conventionally, the TFT array substrate comprising the metal oxide TFT is manufactured by six photolithography processes. If the number of the photolithography processes is reduced, i.e. if the number of mask to be used is reduced, the production efficiency will be improved and the production cost will be decreased.

SUMMARY

According to the embodiment of the invention, a manufacturing method of a TFT array substrate is provided. The TFT array substrate is formed to comprise a plurality of scanning lines, a plurality of data lines and a plurality of pixel units defined by intersecting these scanning lines and these data lines with each other. Each of the pixel units comprises a TFT and a pixel electrode. The TFT is formed to comprise a gate electrode, a gate insulating layer, a metal oxide semiconductor layer used as an active layer, an etch stopping layer formed on a portion of the surface of the metal oxide semiconductor layer, a source electrode and a drain electrode. In this method, the metal oxide semiconductor layer, the source electrode and the drain electrode are formed by a same patterning process.

In the manufacturing method according to the embodiment of the invention, the patterns of the source electrode, the drain electrode and the etch stopping layer are used as a mask for forming the metal oxide semiconductor layer, so that the metal oxide semiconductor layer is simultaneously formed in the patterning process of forming the source electrode and the drain electrode. Therefore, the patterning process special for forming the metal oxide semiconductor layer can be omitted compared with the conventional manufacturing method in which six patterning processes are employed. Therefore, the manufacture procedure can be simplified, the production efficiency can be improved, and the manufacture cost can be decreased.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In the following description, a patterning process may be a photolithography process or other processes for forming patterns such as printing, ink jetting and the like. The photolithography process comprises exposing, developing, etching and the like.

The description hereinafter is mainly made for a single pixel unit, but other pixel units may be formed in the similar manner.

Embodiment 1

Figure 1:
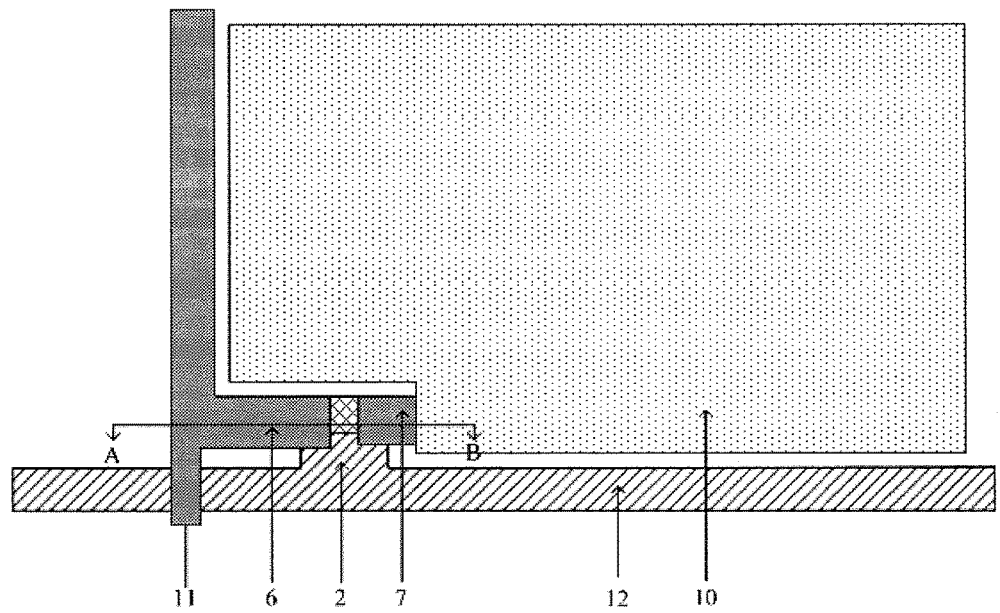
FIG. 1 is a schematic plan view showing a TFT array substrate manufactured by a method according to an embodiment of the invention.

FIG. 1 is a schematic plan view showing a TFT array substrate manufactured by a method according to an embodiment of the invention.

The TFT array substrate comprises a plurality of scanning lines 12 and a plurality of data lines 11. These scanning lines 12 and these data lines 11 intersect with each other to thereby define a plurality of pixel units arranged in a matrix form. Each pixel unit comprises a TFT as a switch element and a pixel electrode for controlling the arrangement of the liquid crystal molecules.

The TFT of each of the pixel units comprises: a gate electrode; a gate insulating layer, formed on the gate electrode; a metal oxide semiconductor layer, acting as an active layer and formed on the gate insulating layer; an etch stopping layer, formed on a portion of the surface of the metal oxide semiconductor layer; a source electrode, one end thereof is provided on the etch stopping layer, and the other end thereof is provided on the metal oxide semiconductor layer; and a drain electrode, one end thereof opposite to the source electrode is provided on the etch stopping layer, and the other end thereof is provided on the metal oxide semiconductor layer. For the thin film transistor, the gate electrode thereof is electrically connected to a corresponding scanning line, the source electrode thereof is electrically connected to a corresponding data line, and the drain electrode thereof is electrically connected to the pixel electrode.

FIG. 2-6 are a sectional views taken along a line A-B in FIG. 1. A manufacturing method of the TFT array substrate according to the embodiment will be described in detail in combination with FIG. 2-6.

According to the embodiment, the manufacturing method of the TFT array substrate comprises the following steps.

Figure 2:
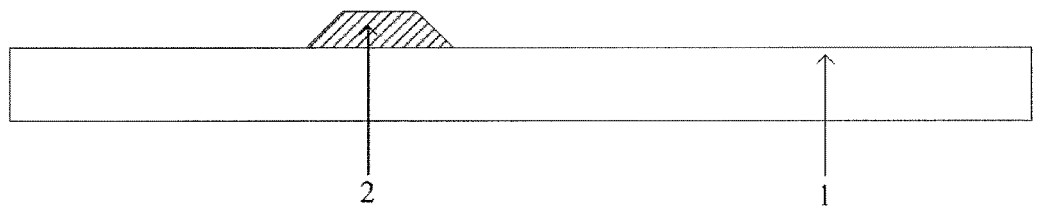
FIG. 2 is a schematic sectional view showing a TFT array substrate after a first patterning process in a manufacturing method according to an embodiment of the invention.

Step S1: forming the gate electrode 2 and the scanning line 12 on a substrate 1 by a patterning, as shown in FIG. 2.

For example, in this step, a gate metal film with a thickness of 2000~10000 Å is deposited on the substrate 1 by a method of sputtering or thermal evaporation. The gate metal film may be made of a single layer formed of any one of Cr, W, Cu, Ti, Ta, Mo, or may be made of an alloy of any one of the above metals, or may be made of multi-layers formed by combination of the above metals. The gate electrode 2 and the scanning line 12 (not shown in FIG. 2) are formed by a patterning process with a normal mask.

Figure 3:
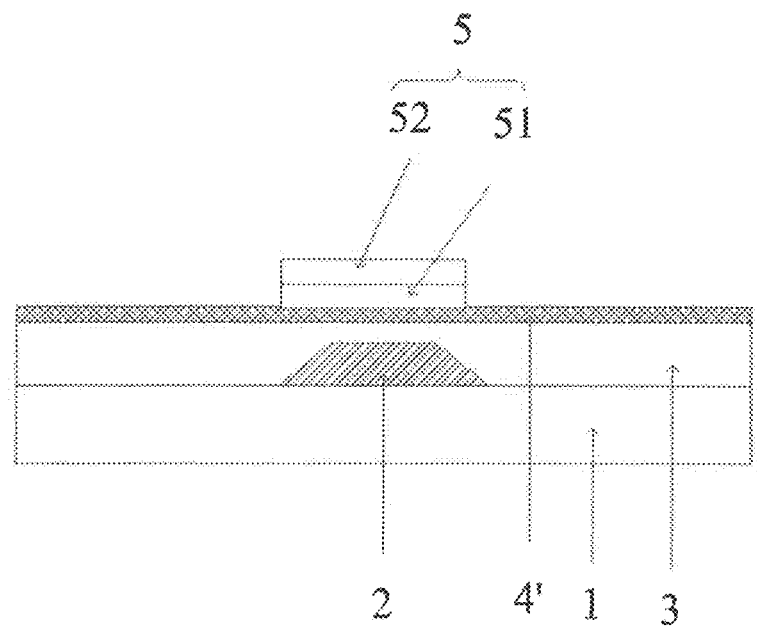
FIG. 3 is a schematic sectional view showing the TFT array substrate after a second patterning process in the manufacturing method according to the embodiment of the invention.

Step S2: forming a gate insulating layer 3 on the substrate 1 after step S1, depositing a metal oxide semiconductor film 4' on the gate insulating layer 3, depositing an etch stopping film on the metal oxide semiconductor film 4', and forming the etch stopping layer 5 on the metal oxide semiconductor film 4' by a patterning process, as shown in FIG. 3.

For example, in this step, the gate insulating layer 3 with a thickness of 2000~8000 Å is deposited on the substrate 1 after step S1 by a PECVD (Plasma Enhanced Chemical Vapor Deposition) method. The gate insulating layer 3 may be formed of silicon oxide $SiO_x$, silicon nitride $SiN_x$, silicon oxynitride $SiN_xO_y$, or insulating metal oxides such as $Al_2O_3$ and the like. The gate insulating layer 3 may be a single layer or multi-layers formed by combination of the above materials. In the PECVD method, the source gases for forming silicon nitride $SiN_x$ may be $SiH_4$, $NH_3$, $N_2$ or $SiH_2Cl_2$, $NH_3$, $N_2$, the source gases for forming silicon oxide $SiO_x$ may be $SiH_4$, $N_2O$, $NH_3$, and the source gases for forming silicon oxynitride $SiN_xO_y$ may be $SiH_4$, $N_2O$, $NH_3$, and $N_2$.

Then, for example, the metal oxide semiconductor film 4' with a thickness of 100~4000 Å is deposited on the gate insulating layer 3 by a method of sputtering or thermal evaporation. The metal oxide semiconductor film 4' may be made of amorphous IGZO, HIZO, IZO, a-InZnO, a-InZnO, ZnO:F, $In_2O_3$:Sn, $In_2O_3$:Mo, $Cd_2SnO_4$, ZnO:Al, $TiO_2$:Nb, Cd—Sn—O or other metal oxide semiconductor.

Next, for example, the etch stopping film with a thickness of 500~4000 Å is deposited by a PECVD method. The etch stopping film may be formed of silicon oxide $SiO_x$, silicon nitride $SiN_x$, silicon oxynitride $SiN_xO_y$, or insulating metal oxides such as $Al_2O_3$ and the like. The etch stopping film may be a single layer or multi-layers formed by combination of the above materials. In the PECVD method, the source gases for forming silicon nitride $SiN_x$ may be $SiH_4$, $NH_3$, $N_2$ or $SiH_2Cl_2$, $NH_3$, $N_2$, the source gases for forming silicon oxide $SiO_x$ may be $SiH_4$, $N_2O$, $NH_3$, and the source gases for forming silicon oxynitride $SiN_xO_y$ may be $SiH_4$, $N_2O$, $NH_3$, and $N_2$.

Then, the etch stopping layer 5 is formed by performing a patterning process on the etch stopping film with a normal mask, as shown in FIG. 3.

Figure 4:
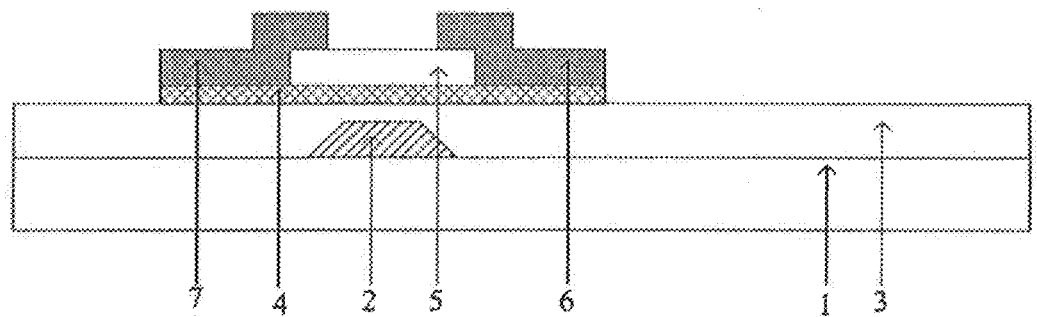
FIG. 4 is a schematic sectional view showing the TFT array substrate after a third patterning process in the manufacturing method according to the embodiment of the invention.

Step S3: depositing a source/drain metal film on the substrate 1 after step S2, and forming the source electrode 6, the drain electrode 7, the data line 11 and the metal oxide semiconductor layer 4 by a patterning process, as shown in FIG. 4.

In this patterning process, the patterns of the source electrode 6, the drain electrode 7 and the etch stopping layer 5 are used as a mask for forming the metal oxide semiconductor layer 4, and the metal oxide semiconductor layer 4 is formed at the same time of forming the source electrode 6, the drain electrode 7 and the data line 11.

For example, in this step, the source/drain metal film with a thickness of 2000~10000 Å is deposited on the substrate 1 after the step S2 by a method of sputtering or thermal evaporation. The source/drain metal film may be made of a single layer formed of any one of Cr, W, Cu, Ti, Ta, Mo, or may be made of an alloy of any one of the above metals, or may be made of multi-layers formed by combination of the above metals. The source electrode 6, the drain electrode 7 and the data line 11 (not shown in FIG. 4) are formed by a patterning process with a normal mask. In addition, in this step, the patterns of the source electrode 6, the drain electrode 7 and the etch stopping layer 5 are used as a mask, and the metal oxide semiconductor layer 4 is simultaneously formed in the patterning process of forming the source electrode 6, the drain electrode 7 and the data line 11.

In this step, the source electrode 6, the drain electrode 7, the data-line 11 and the metal oxide semiconductor layer 4 can be formed simultaneously by using a same patterning process. Specifically, in this step, the patterns of the source electrode 6, the drain electrode 7 and the etch stopping layer 5 block light from being incident on the metal oxide semiconductor film 4' in the region of forming the metal oxide semiconductor layer 4 (i.e. the patterns of the source and drain electrodes 6 and 7 and the etch stopping layer 5 are used a mask), so that the mask special for forming the metal oxide semiconductor layer in the conventional technology can be omitted. That is, compared with the conventional technology, the individual patterning process for forming the metal oxide semiconductor layer can be omitted in this embodiment of the invention. By comparing FIG. 3 with FIG. 4, the principle of the source and drain electrodes and the etch stopping layer using as mask can be clearly understood.

Figure 5:
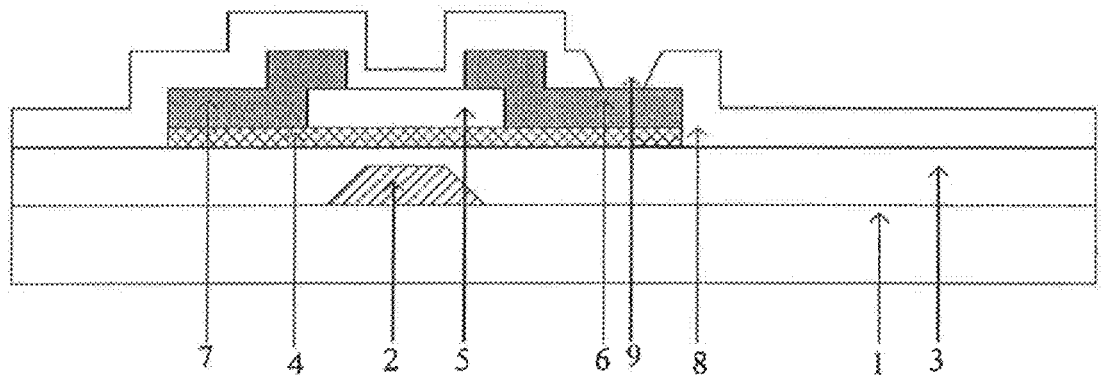
FIG. 5 is a schematic sectional view showing the TFT array substrate after a fourth patterning process in the manufacturing method according to the embodiment of the invention.

Step S4: depositing a protective layer 8 on the substrate 1 after step S3 and forming a contact via hole 9 by a patterning process, as shown in FIG. 5.

For example, in this step, the protective layer 8 with a thickness of 2000~8000 Å is deposited on the substrate 1 after step S3 by a PECVD method. The protective layer 8 may be formed of silicon oxide $SiO_x$, silicon nitride $SiN_x$, silicon oxynitride $SiN_xO_y$, or insulating metal oxides such as $Al_2O_3$ and the like. In the PECVD method, the source gases for forming silicon nitride $SiN_x$ may be $SiH_4$, $NH_3$, $N_2$ or $SiH_2Cl_2$, $NH_3$, $N_2$, the source gases for forming silicon oxide $SiO_x$ may be $SiH_4$, $N_2O$, $NH_3$, and the source gases for forming silicon oxynitride $SiN_xO_y$ may be $SiH_4$, $N_2O$, $NH_3$, and $N_2$.

Then, the contact via hole 9 is formed by a patterning process with a normal mask, as shown in FIG. 5.

Figure 6:
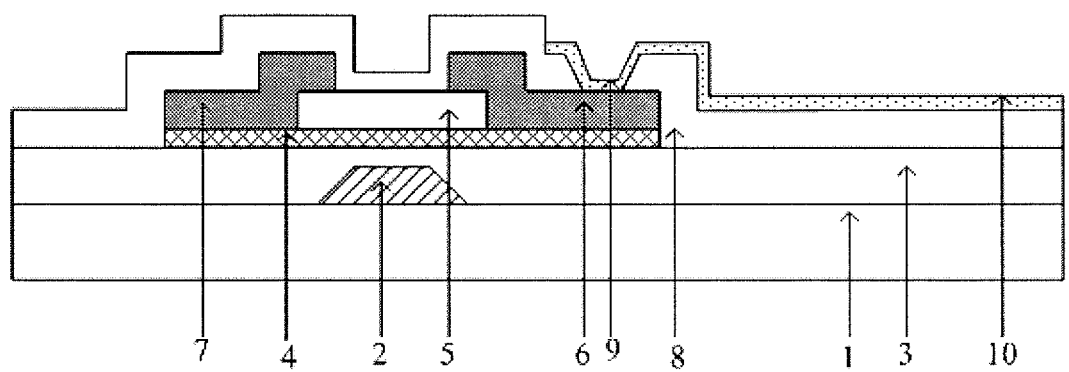
FIG. 6 is a schematic sectional view showing the TFT array substrate after a fifth patterning process in the manufacturing method according to the embodiment of the invention.

Step S5: depositing a transparent conductive film on the substrate 1 after step S4, and forming the pixel electrode 10 by a patterning process, as shown in FIG. 6.

For example, in this step, the transparent conductive film with the thickness of 300~1500 Å is deposited on the substrate 1 after step S4 by a method of sputtering or thermal evaporation. The transparent conductive film may be made of ITO or other transparent metals or metal oxides. Then, the transparent pixel electrode 10 is formed by a patterning process with a normal mask.

Embodiment 2

In the above embodiment 1, in step S2, both of the gate insulating layer 3 and the etch stopping layer 5 have a single-layer structure. However, in this embodiment, both of the gate insulating layer 3 and the etch stopping layer 5 have a double-layer structure.

In the double-layer structure of the gate insulating layer 3, the layer which contacts the metal oxide semiconductor layer 4 is a protective layer, and the layer which does not contact the metal oxide semiconductor layer 4 is an insulating layer. For example, the protective layer is made of SiOx and is formed by a low-speed deposition method. For example, the insulating layer is made of SiNx and is formed by a high-speed deposition method. During the process of depositing the gate insulating layer 3, the insulating layer is firstly deposited by the high-speed deposition method, and then the protective layer is deposited by the low-speed deposition method.

In the double-layer structure of the etch stopping layer 5, the layer which contacts the metal oxide semiconductor layer 4 is a protective layer 51 and the layer which does not contact the metal oxide semiconductor layer 4 is a barrier layer 52 (as shown in FIG. 3). For example, the protective layer 51 is made of SiOx and is formed by a low-speed deposition method. For example, the barrier layer 52 is made of SiNx and is formed by a high-speed deposition. During the process of depositing the etch stopping layer 5, the protective layer 51 is firstly deposited by the low-speed deposition, and then the barrier layer 52 is deposited by the high-speed deposition.

On one hand, since the low-speed deposition method is used to deposit both the protective layer in the gate insulating layer and the protective layer in the etch stopping layer which contact the metal oxide semiconductor layer 4, these protective layers can have a good compactness. Thus, good interfaces can be formed between these protective layers and the metal oxide semiconductor layer 4, and accordingly the stability of the TFT can be improved. On the other hand, since the high-speed deposition method is used to deposit both the insulating layer in the gate insulating layer and the barrier layer in the etch stopping layer which are away from the metal oxide semiconductor layer 4, these layers can be formed rapidly and thus the production efficiency can be effectively improved.

In the manufacturing method of the TFT array substrate provided with metal oxide TFT according to the embodiments of the invention, the patterns of the source/drain electrodes and the etch stopping layer are used as the mask for forming the metal oxide semiconductor layer, and thus the patterning process special for forming the metal oxide semiconductor layer can be omitted compared with the conventional manufacturing method in which six patterning processes are employed. Therefore, the manufacture procedure can be simplified, the production efficiency can be improved, and the manufacture cost can be decreased.

The embodiments of the invention are particularly suitable for manufacturing the TFT-LCD and AMOLED of large size and high resolution.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A manufacturing method of a TFT array substrate,
   the TFT array substrate being formed to comprise a plurality of scanning lines, a plurality of data lines and a plurality of pixel units defined by intersecting these scanning lines and these data lines with each other, each of the pixel units comprising a TFT and a pixel electrode,
   the TFT being formed to comprise: a gate electrode, a gate insulating layer, a metal oxide semiconductor layer used as an active layer, an etch stopping layer formed on a portion of the surface of the metal oxide semiconductor layer, a source electrode and a drain electrode,
   wherein the metal oxide semiconductor layer, the source electrode and the drain electrode are formed by a same patterning process using one single-tone mask,
   during the same patterning process using one single-tone mask for forming the metal oxide semiconductor layer, the source electrode and the drain electrode, the metal oxide semiconductor layer is formed at the same time of forming the source electrode and the drain electrode,
   the source electrode and the drain electrode directly contact a portion of the metal oxide semiconductor layer, and
   during the same patterning process using one single-tone mask for forming the metal oxide semiconductor layer, the source electrode and the drain electrode, a portion of the metal oxide semiconductor layer which is directly opposite to the gate electrode is completely remained.

2. The manufacturing method according to claim 1, wherein during the same patterning process for forming the source electrode and the drain electrode, the patterns of the source electrode, the drain electrode and the etch stopping layer are used as a mask to form the metal oxide semiconductor layer, so that the metal oxide semiconductor layer is formed at the same time of forming the source electrode and the drain electrode.

3. The manufacturing method according to claim 2, wherein the method comprises the following steps:
   step S1: forming a gate metal film on a substrate, and forming the gate electrode and the scanning lines by a patterning process;
   step S2: forming the gate insulating layer on the substrate after step S1, depositing a metal oxide semiconductor film on the gate insulating layer, depositing an etch stopping film on the metal oxide semiconductor film, and forming the etch stopping layer by a patterning process;
   step S3: depositing a source/drain metal film on the substrate after step S2, and forming the source electrode, the drain electrode, the data lines and the metal oxide semiconductor layer by the same a patterning process;

step S4: forming a protective layer on the substrate after step S3, and forming a contact via hole by a patterning process; and step S5: depositing a transparent conductive film on the substrate after step S4, and forming the pixel electrode by a patterning process, the pixel electrode being connected to the drain electrode by the contact via hole.

4. The manufacturing method according to claim 3, wherein all patterning processes in steps S1 to S5 employ single-tone masks.

5. The manufacturing method according to claim 1, wherein the source electrode is formed such that one end thereof is provided on the etch stopping layer and the other end thereof is provided on and directly contacts the metal oxide semiconductor layer; and wherein the drain electrode is formed such that one end thereof opposite to the source electrode is provided on the etch stopping layer and the other end thereof is provided on and directly contacts the metal oxide semiconductor layer.

6. The manufacturing method according to claim 1, wherein, the metal oxide semiconductor layer is made of amorphous IGZO, HIZO, IZO, a-InZnO, ZnO:F, $In_2O_3$:Sn, $In_2O_3$:Mo, $Cd_2SnO_4$, ZnO:Al, $TiO_2$:Nb, Cd—Sn—O.

7. The manufacturing method according to claim 1, wherein the gate insulating layer has a double-layer structure, and wherein in the double-layer structure of the gate insulating layer, a layer which contacts the metal oxide semiconductor layer is a protective layer, and a layer which does not contact the metal oxide semiconductor layer is an insulating layer.

8. The manufacturing method according to claim 7, wherein the protective layer is made of $SiO_x$ and is formed by a low-speed deposition method.

9. The manufacturing method according to claim 7, wherein the insulating layer is made of $SiN_x$ and is formed by a high-speed deposition method.

10. The manufacturing method according to claim 1, wherein the etch stopping layer has a double-layer structure; and in the double-structure layer of the etch stopping layer, a layer which contacts the metal oxide semiconductor layer is a protective layer and a layer which does not contact the metal oxide semiconductor layer is a barrier layer.

11. The manufacturing method according to claim 10, wherein the protective layer is made of $SiO_x$.

12. The manufacturing method according to claim 10, wherein the barrier layer is made of $SiN_x$.

13. The manufacturing method according to claim 10, wherein deposition speed of the protective layer is smaller than that of the barrier layer.

14. The manufacturing method according to claim 1, wherein the gate insulating layer has a single-layer structure and is made of silicon oxide, silicon nitride or silicon oxynitride.

15. The manufacturing method according to claim 1, wherein the etch stopping layer has a single-layer structure and is made of silicon oxide, silicon nitride or silicon oxynitride.

* * * * *